(12) United States Patent
Qu et al.

(10) Patent No.: US 11,959,191 B2
(45) Date of Patent: Apr. 16, 2024

(54) METHOD FOR MANUFACTURING SILICON SINGLE CRYSTAL WAFER AND SILICON SINGLE CRYSTAL WAFER

(71) Applicant: SHIN-ETSU HANDOTAI CO., LTD., Tokyo (JP)

(72) Inventors: Wei Feng Qu, Takasaki (JP); Shizuo Igawa, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 247 days.

(21) Appl. No.: 17/601,112

(22) PCT Filed: Feb. 5, 2020

(86) PCT No.: PCT/JP2020/004397
§ 371 (c)(1),
(2) Date: Oct. 4, 2021

(87) PCT Pub. No.: WO2020/213230
PCT Pub. Date: Oct. 22, 2020

(65) Prior Publication Data
US 2022/0195620 A1   Jun. 23, 2022

(30) Foreign Application Priority Data

Apr. 16, 2019 (JP) ................. 2019-077651

(51) Int. Cl.
*C30B 29/06* (2006.01)
*C30B 33/02* (2006.01)
*H01L 21/322* (2006.01)

(52) U.S. Cl.
CPC .............. *C30B 29/06* (2013.01); *C30B 33/02* (2013.01); *H01L 21/322* (2013.01)

(58) Field of Classification Search
CPC ........ C30B 29/06; C30B 33/02; H01L 21/322
See application file for complete search history.

(56) References Cited

U.S. PATENT DOCUMENTS

2007/0025239 A1\* 2/2007 Jain ..................... H04L 63/0414
370/389
2007/0252239 A1   11/2007 Maeda et al.
(Continued)

FOREIGN PATENT DOCUMENTS

JP    2005-311200 A    11/2005
JP    2007-194232 A     8/2007
(Continued)

OTHER PUBLICATIONS

May 2, 2023 Office Action Issued in Japanese Patent Application No. 2021-514801.
(Continued)

*Primary Examiner* — Robert M Kunemund
(74) *Attorney, Agent, or Firm* — Oliff PLC

(57) ABSTRACT

A method for manufacturing a silicon single crystal wafer for a multilayer structure device including: using a silicon single crystal wafer with oxygen concentration of 12 ppma (JEITA) or higher and composing an $N_V$ region; and performing an RTA treatment in a nitrogen-containing atmosphere and a temperature of 1225° C. or higher, a mirror-polish processing treatment, and a BMD-forming heat treatment manufacturing a silicon single crystal wafer having at least a DZ layer with a thickness of 5 to 12.5 µm and a BMD layer positioned immediately below the DZ layer and a BMD density of $1\times10^{11}/cm^3$ or higher from the silicon single crystal wafer surface. During device formation, the silicon wafer surface stress is absorbed immediately below a surface layer, distortion defects are absorbed by the BMD layer, device formation region strength is enhanced, and surface layer dislocation occurrence and extension is suppressed.

1 Claim, 3 Drawing Sheets

(56) References Cited

U.S. PATENT DOCUMENTS

| | | | |
|---|---|---|---|
| 2009/0000535 A1* | 1/2009 | Ebara | ............ C30B 15/04 |
| | | | 257/E21.321 |
| 2010/0105191 A1 | 4/2010 | Hayamizu et al. | |
| 2014/0044945 A1 | 2/2014 | Mueller et al. | |
| 2014/0141537 A1 | 5/2014 | Falster et al. | |
| 2015/0325433 A1 | 11/2015 | Mueller et al. | |
| 2017/0253995 A1 | 9/2017 | Qu et al. | |
| 2018/0182641 A1* | 6/2018 | Lee | ............ C30B 33/005 |

FOREIGN PATENT DOCUMENTS

| | | | |
|---|---|---|---|
| JP | 4055343 B2 | 3/2008 | |
| JP | 4794137 B2 | 10/2011 | |
| JP | 2014-034513 A | 2/2014 | |
| JP | 2015-216375 A | 12/2015 | |
| JP | 2016-504759 A | 2/2016 | |
| JP | 2016-100542 A | 5/2016 | |
| JP | 2016-111044 A | 6/2016 | |
| TW | 201426877 A | 7/2014 | |
| WO | 2008/105136 A1 | 9/2008 | |
| WO | 2016/084287 A1 | 6/2016 | |
| WO | 2018/037755 A1 | 3/2018 | |
| WO | 2018/108735 A1 | 6/2018 | |
| WO | 2019/159539 A1 | 8/2019 | |

OTHER PUBLICATIONS

May 19, 2020 Search Report issued in International Patent Application No. PCT/JP2020/004397.

Sep. 28, 2021 International Preliminary Report on Patentability issued in International Patent Application No. PCT/JP2020/004397.

Jan. 3, 2024 Office Action and Search Report issued in Taiwanese Patent Application No. 109104848.

* cited by examiner

[FIG. 1]
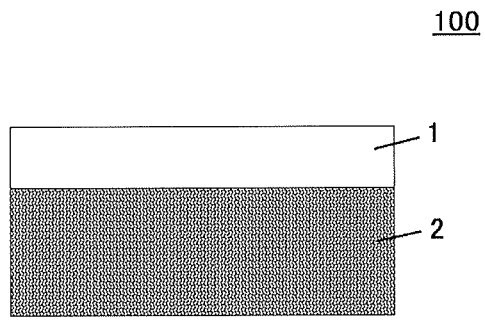
[FIG. 2]
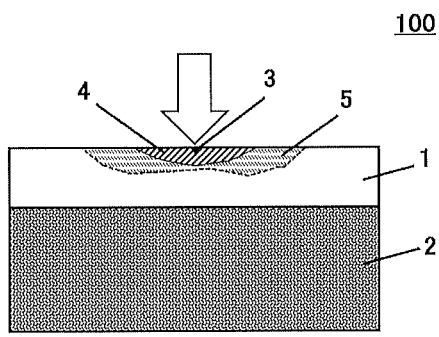
[FIG. 3]
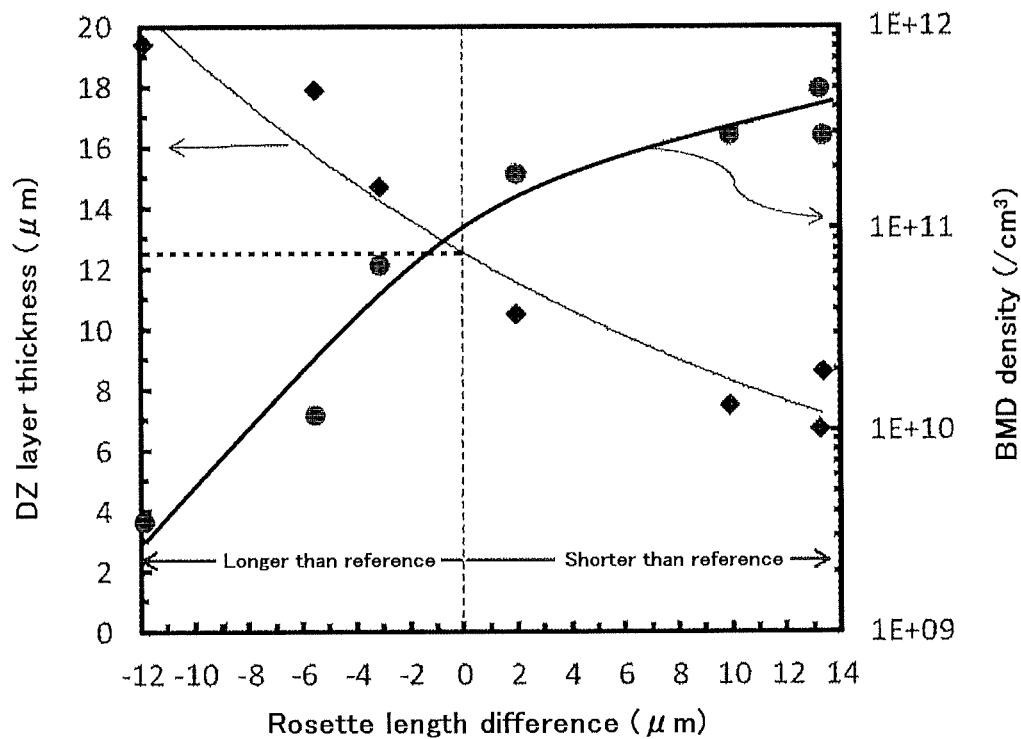

[FIG. 4]
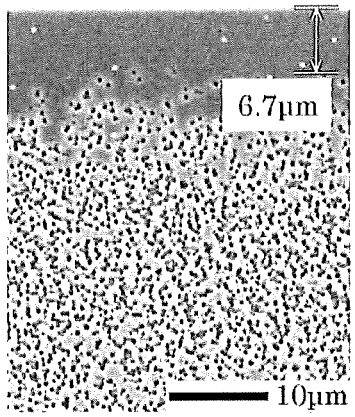
[FIG. 5]
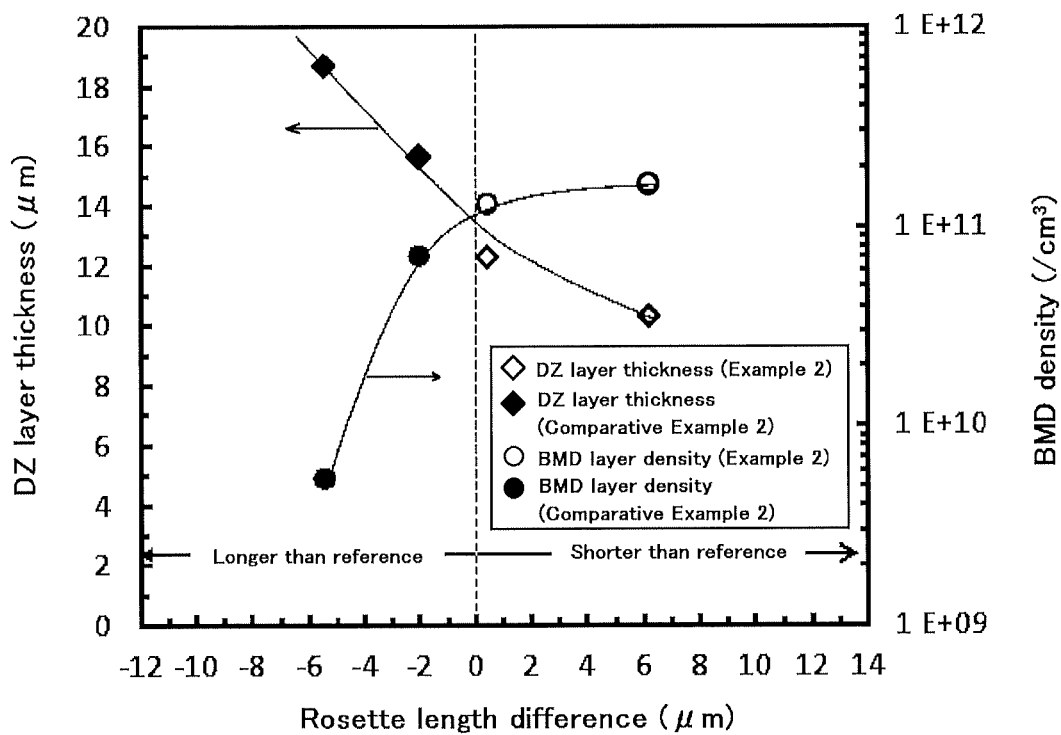

[FIG. 6]
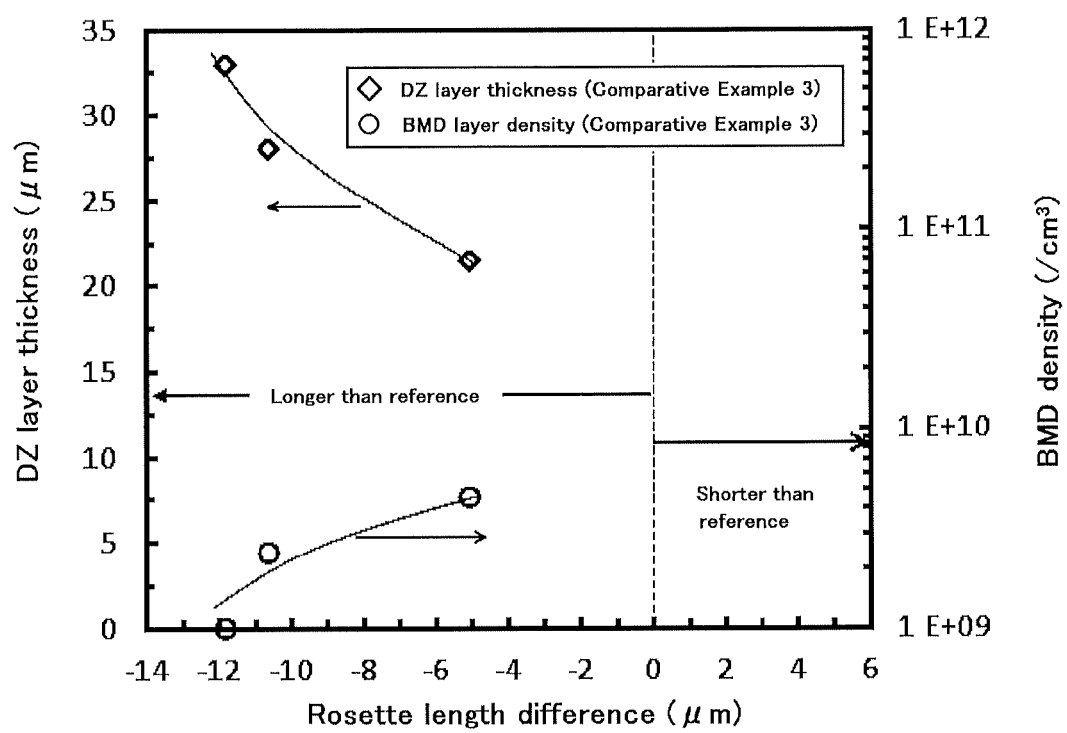

METHOD FOR MANUFACTURING SILICON SINGLE CRYSTAL WAFER AND SILICON SINGLE CRYSTAL WAFER

TECHNICAL FIELD

The present invention relates to: a method for manufacturing a silicon single crystal wafer for a multilayer structure device; and a silicon single crystal wafer.

BACKGROUND ART

In the latest memory (3D Xpoint), higher strength in a silicon substrate in a device region (a depth in a range of about 0.5 μm from a surface) and improvement in strength in a surface layer of a substrate by lamination of 3D NAND are required.

Generally, a silicon single crystal is doped with nitrogen, carbon, and boron for the purpose of imparting gettering capability and enhancement of strength in the bulk portion. However, there is a problem that if nitrogen, carbon, and boron are doped at a high concentration, an oxide precipitate is formed on the surface layer so that electrical characteristics are degraded. Against such a problem, measures of outwardly diffusing impurities by a heat treatment are being taken. In this event, a DZ layer is formed in the surface layer. This DZ layer has a low oxygen concentration due to the outward diffusion of oxygen, so that slips are liable to occur due to stress received during device formation.

In addition, Patent Document 1, Patent Document 2, and Patent Document 3 disclose techniques for controlling BMD density so that an oxide precipitate cannot be formed excessively. Patent Document 4 discloses a single crystal wafer having a proximity gettering capability adjoining a denuded zone.

CITATION LIST

Patent Literature

Patent Document 1: JP 2016-100542 A
Patent Document 2: JP 4055343 B
Patent Document 3: JP 4794137 B
Patent Document 4: JP 2015-216375 A
Patent Document 5: JP 2016-111044 A

SUMMARY OF INVENTION

Technical Problem

However, even single crystal wafers such as those disclosed in Patent Documents 1-4 have a problem that slips occur in device formation regions when a multilayer structure device is formed on a single crystal wafer. Accordingly, a silicon single crystal wafer has been desired in which slips do not occur in device formation regions even when a multilayer structure device is formed.

The present invention has been made to solve the above-described problems, and an object thereof is to provide a method for manufacturing a silicon single crystal wafer for a multilayer structure device, and a silicon single crystal wafer, according to which defects induced by distortion due to stress that a surface of the silicon wafer receives during device formation can be absorbed by a BMD layer immediately below a surface layer, strength of a device formation region can be enhanced, and the occurrence and extension of dislocations in the surface layer can be suppressed.

Solution to Problem

The present invention has been made to achieve the above-described object, and provides a method for manufacturing a silicon single crystal wafer for a multilayer structure device, the method comprising:
  using a silicon single crystal wafer which has an oxygen concentration of 12 ppma (JEITA) or higher and which is composed of an $N_V$ region; and
  performing an RTA treatment in a nitrogen-containing atmosphere and at a temperature of 1225° C. or higher, a mirror-polish processing treatment, and a BMD-forming heat treatment to manufacture a silicon single crystal wafer having at least a DZ layer with a thickness of 5 to 12.5 μm and a BMD layer which is positioned immediately below the DZ layer and which has a BMD density of $1 \times 10^{11}/cm^3$ or higher in order from a surface of the silicon single crystal wafer.

According to such a method for manufacturing a silicon single crystal wafer, it is possible to obtain a silicon single crystal wafer for a multilayer structure device which makes it possible to enhance the strength of a device formation region and to suppress the occurrence and extension of dislocations in the surface layer.

In this event, the RTA treatment can be performed under heat treatment conditions of less than 10 seconds and a temperature falling rate of 30° C./second or higher.

In this manner, it is possible to obtain a silicon single crystal wafer that has a higher effect of suppressing the outward diffusion of vacancies, can make the vacancy distribution in a depth direction more precipitous, and has a more precipitous BMD density distribution.

In this event, the BMD-forming heat treatment can be performed under heat treatment conditions of an argon atmosphere, a temperature of 870 to 950° C., and 2 hours or more.

In this manner, it is possible to make only those having a large precipitate nucleus size to some extent grow, and therefore, BMD distribution can be made more precipitous.

The present invention has been made to achieve the above-described object, and provides a silicon single crystal wafer for a multilayer structure device, wherein
  the silicon single crystal wafer is composed of an $N_V$ region,
  has at least a DZ layer and a BMD layer which is positioned immediately below the DZ layer in order from a surface of the silicon single crystal wafer, and
  the DZ layer has a thickness of 5 to 12.5 μm and the BMD layer has a BMD density of $1 \times 10^{11}/cm^3$ or higher.

Such a silicon single crystal wafer is a silicon single crystal wafer for a multilayer structure device with which strength of a device formation region can be enhanced and the occurrence and extension of dislocations in the surface layer can be suppressed.

In this event, when a dent with a dent depth of Depth on the surface of the silicon single crystal wafer is formed so as to satisfy a relational equation $$Depth = 3 \times Fz^{0.6}$$

(wherein Depth is a dent depth (unit: μm), Fz is a pushing pressure (unit: N), and Depth is 0.01 μm or more and less than 5.00 μm)
  by applying the pushing pressure Fz, the silicon single crystal wafer may have a stacked structure with at least 3 layers including a strained layer, a DZ layer, and a BMD layer in order from the surface, and when the silicon single crystal wafer having the dent formed is subjected to a heat treatment at a temperature of 900° C. for 1 hour, a rosette length of a dislocation of the DZ layer after the heat treatment may become shorter than a rosette length of a dislocation of the DZ layer before the heat treatment.

In this manner, the ability to suppress the extension of dislocations becomes higher.

Advantageous Effects of Invention

As described above, according to the inventive method for manufacturing a silicon single crystal wafer, it is possible to manufacture a silicon single crystal wafer for a multilayer structure device with which strength of a device formation region can be enhanced and the occurrence and extension of dislocations in the surface layer can be suppressed. In addition, the inventive silicon single crystal wafer is a silicon single crystal wafer for a multilayer structure device with which strength of a device formation region can be enhanced and the occurrence and extension of dislocations in the surface layer can be suppressed.

BRIEF DESCRIPTION OF DRAWINGS

FIG. 1 shows a silicon single crystal wafer according to the present invention.

FIG. 2 shows an explanatory diagram of a rosette test.

FIG. 3 shows the relationship between DZ layer thickness, BMD density, and rosette length difference.

FIG. 4 shows an observation photograph of a cross section of a silicon single crystal wafer according to the present invention.

FIG. 5 shows the relationship between DZ layer thickness, BMD density, and rosette difference in Example 2 and Comparative Example 2.

FIG. 6 shows the relationship between DZ layer thickness, BMD density, and rosette length difference in Comparative Example 3.

DESCRIPTION OF EMBODIMENTS

Hereinafter, the present invention will be described in detail, but the present invention is not limited thereto.

As described above, the following have been desired a method for manufacturing a silicon single crystal wafer for a multilayer structure device, and a silicon single crystal wafer, according to which defects induced by distortion due to stress that a surface of the silicon wafer receives during device formation can be absorbed by a BMD layer immediately below a surface layer, strength of a device formation region can be enhanced, and the occurrence and extension of dislocations in the surface layer can be suppressed.

The present inventors have earnestly studied the above-described problems and found out a method for manufacturing a silicon single crystal wafer for a multilayer structure device, the method including: using a silicon single crystal wafer which has an oxygen concentration of 12 ppma (JEITA) or higher and which is composed of an $N_V$ region; and performing an RTA treatment in a nitrogen-containing atmosphere and at a temperature of 1225° C. or higher, a mirror-polish processing treatment, and a BMD-forming heat treatment to manufacture a silicon single crystal wafer having at least a DZ layer with a thickness of 5 to 12.5 μm and a BMD layer which is positioned immediately below the DZ layer and which has a BMD density of $1 \times 10^{11}/cm^3$ or higher in order from a surface of the silicon single crystal wafer. The present inventors have found out that according to the method, it is possible to manufacture a silicon single crystal wafer for a multilayer structure device with which strength of a device formation region can be enhanced and the occurrence and extension of dislocations in the surface layer can be suppressed. Thus, the present invention has been completed.

In addition, the present inventors have found out a silicon single crystal wafer for a multilayer structure device, where the silicon single crystal wafer is composed of an $N_V$ region, has at least a DZ layer and a BMD layer which is positioned immediately below the DZ layer in order from a surface of the silicon single crystal wafer, and the DZ layer has a thickness of 5 to 12.5 μm and the BMD layer has a BMD density of $1 \times 10^{11}/cm^3$ or higher. The present inventors have found out that thus, it is possible to achieve a silicon single crystal wafer for a multilayer structure device with which strength of a device formation region can be enhanced and the occurrence and extension of dislocations in the wafer surface layer can be suppressed. Thus, the present invention has been completed.

Hereinafter, a description will be given with reference to the drawings.

The present inventors have investigated, paying attention to the thickness of a DZ layer 1 and the BMD density of a BMD layer 2 of a silicon single crystal wafer 100 having at least a DZ layer 1 and a BMD layer 2 positioned immediately below the DZ layer 1 as shown in FIG. 1, and found out that strength of a device formation region can be enhanced and the occurrence and extension of dislocations in the surface layer can be suppressed when the thickness of the DZ layer 1 and the BMD density of the BMD layer 2 satisfy a certain relation.

Firstly, silicon single crystal CW (Chemical etched wafer) wafers that have a defect region of an $N_V$ region across the entire surface and have different oxygen concentrations were prepared. Then, changing the conditions of an RTA treatment and a BMD-forming heat treatment, silicon single crystal PW (Polished wafer) wafers having various DZ layer thicknesses and BMD densities in the BMD layer were fabricated to investigate the effect of suppressing the occurrence and extension of dislocations (the effect of absorbing dislocations). The details and results of the investigations are given below.

Silicon single crystal CW wafers having a diameter of 300 mm, being <100>, P-type, 10 Ωcm, having an oxygen concentration of 14 ppma (JEITA), and having a defect region of an $N_V$ region (a region that is defect-free, but in which vacancies of saturated concentration or lower are dominant) across the entire surface were prepared. These CW wafers were subjected to a heat treatment at a temperature of 1150 to 1300° C. for a duration of 9 seconds in an $NH_3+Ar$ atmosphere as an RTA treatment. Subsequently, a PW-process was performed with a target machining allowance of 6 μm. In this manner, a nitride film formed in the RTA treatment was removed. Lastly, a heat treatment was performed at a temperature of 1200° C. for a duration of 2 hours in an Ar atmosphere as the BMD-forming heat treatment. The DZ layer thickness and the BMD density of the obtained silicon single crystal PW wafers were measured. Thus, samples with DZ layer thicknesses of 0.5 to 19.4 μm and BMD densities of $3.5 \times 10^9/cm^3$ to $4.9 \times 10^{11}/cm^3$ were obtained.

The effect of suppressing the occurrence and extension of dislocations was evaluated by a rosette test (measurement and comparison of rosette length). Specifically, a dent with a depth of 0.01 µm or more and less than 5.00 µm was formed with a dent pressure of 0.24 to 2.9 N in a silicon single crystal PW wafer having a DZ layer and a BMD layer fabricated in the above manner, and the rosette length was measured. In addition, after forming the dent, the rosette length was also measured after further performing a heat treatment at 900° C. for 1 hour. Then, the rosette lengths before and after the heat treatment were compared.

Here, the rosette test will be described. The dislocation suppression effect of the inventive silicon single crystal wafer can be evaluated by the length of the dislocation (rosette length). The rosette test is the evaluation method disclosed in Patent Document 5. In this evaluation method, a dent is formed in a surface of a wafer to be evaluated to apply a distortion in a surface layer of the wafer. A heat treatment is subsequently performed to extend a dislocation, and the length of the dislocation (rosette length) is measured. It can be judged that the shorter the length of the dislocation, the higher the ability to suppress the occurrence and extension of dislocations.

Below, a specific evaluation method will be described with reference to the explanatory diagram of the rosette test in FIG. 2. Firstly, a pushing pressure is applied to a surface layer of a prepared silicon single crystal wafer 100 by using, for example, a Vickers hardness tester to form a dent 3. Note that it is sufficient to be able to form a dent by applying a pushing pressure to the surface layer of the wafer, and the equipment used, etc. are not particularly limited.

In the formation of the dent, the dent 3 with a dent depth of Depth on the surface of the wafer is preferably formed so as to satisfy a relational equation Depth=$3\times Fz^{0.6}$ (where Depth is a dent depth (unit: µm), Fz is a pushing pressure (unit: N), and Depth is 0.01 µm or more and less than 5.00 µm) by applying the pushing pressure Fz. When the dent is formed in this manner, it is possible to achieve a stacked structure with at least 3 layers including a strained layer 4, a DZ layer 1, and a BMD layer 2 in order from the surface. When a dent 3 is formed under such conditions, the effect of suppressing the occurrence and extension of dislocations can be evaluated with high accuracy.

After forming the dent, the silicon wafer is preferably subjected to a heat treatment in order to extend the rosette length sufficiently. A dislocation extension region 5 is formed by performing the heat treatment (FIG. 2). In the heat treatment performed here, the heat treatment temperature can be 850° C. or higher and 1200° C. or lower, for example. In this manner, with 850° C. or higher, the temperature is the brittle-ductile transition temperature of silicon or higher, and sufficient dislocation can be extended on evaluation. Meanwhile, with 1200° C. or lower, treatment in a vertical heat treatment furnace is possible.

The heat treatment time can be, for example, 30 minutes or more to 1 hour or less. Time within such a range is sufficient for extending a dislocation. Furthermore, an Ar atmosphere is possible. This is because Ar has no effect of inhibiting the motion of a dislocation, so that the strength of the wafer itself can be evaluated more accurately. In particular, when the heat treatment conditions are set to 900° C. and 1 hour, the dislocations in the DZ layer can be efficiently extended, and the effect of the dislocations being absorbed by the BMD layer after the heat treatment can be observed more accurately. As a result, a wafer having a higher ability to suppress the occurrence and extension of dislocations can be obtained.

Next, in order to measure the length of a dislocation, selective etching is performed to expose the dislocation. The method for the selective etching is not particularly limited, and it is sufficient to be able to expose the dislocation. For example, it is possible to perform wet etching using an etching solution which is a mixture of hydrofluoric acid, nitric acid, acetic acid, and water (C solution in JISH0609-199). It is also possible to perform dry etching such as reactive ion etching (RIE: Reactive Ion Etching).

After exposing the dislocation that extends from the dent in this manner, the length of the dislocation (rosette length) is measured.

FIG. 3 shows the results of the investigations carried out by the present inventors in order to achieve the above-described object. FIG. 3 shows the relationship between the rosette length, the DZ layer thickness, and the BMD density. The horizontal axis of the graph shown in FIG. 3 is the difference between a reference value (reference) and the rosette length of each sample after performing the heat treatment at the temperature of 900° C. for 1 hour (hereinafter, referred to as "rosette length difference"), when the rosette length of the silicon single crystal PW wafer before performing the heat treatment at the temperature of 900° C. for 1 hour is set as the reference value of a reference. That is, the range in which the rosette length difference of the horizontal axis of FIG. 3 is a positive value indicates that the rosette length after performing the heat treatment at the temperature of 900° C. for 1 hour has become shorter than that of the silicon single crystal PW wafer before performing the heat treatment at the temperature of 900° C. for 1 hour, and indicates that the effect of suppressing the occurrence and extension of dislocations is high. On the contrary, the range in which the rosette length difference of the horizontal axis of FIG. 3 is a negative value indicates that the rosette length after performing the heat treatment at the temperature of 900° C. for 1 hour has become longer than that of the silicon single crystal PW wafer before performing the heat treatment at the temperature of 900° C. for 1 hour, and indicates that there is no effect of suppressing the occurrence and extension of dislocations.

Meanwhile, in FIG. 3, the first axis of the vertical axes (the vertical axis on the left) shows the thickness of the DZ layer of the silicon single crystal wafer subjected to the RTA treatment and the BMD-forming heat treatment, and the second axis of the vertical axes (the vertical axis on the right) shows the BMD density of the BMD layer of the silicon single crystal wafer subjected to the RTA treatment and the BMD-forming heat treatment.

As shown in FIG. 3, it has been found that within the range in which the thickness of the DZ layer is 12.5 µm or less and the BMD density of the BMD layer is $1\times10^{11}/cm^3$ or more, the rosette length difference is within the range of a positive value. That is, the effect of suppressing the occurrence and extension of dislocations becomes high, and a wafer suitable for a multilayer structure device can be obtained. When the thickness of the DZ layer is 10 µm or less, the above-described effect can be achieved more stably. Note that, as described in detail in the comparison of Example 1 and Comparative Example 1 below, a condition for the rosette length difference being in the range of a positive value is for the RTA treatment temperature to be 1225° C. or higher. In addition, the reason for setting the thickness of the DZ layer to 5 µm or more is to ensure a device producing region.

The silicon single crystal wafer 100 according to the present invention is composed of an $N_V$ region, and has at least a DZ layer 1 and a BMD layer 2 positioned immediately below the DZ layer 1 in order from the surface of the wafer as shown in FIG. 1. Here, "positioned immediately below" has the same meaning as "adjoining". In addition, regarding the BMD layer 2, the whole of the silicon single crystal wafer 100 excluding the DZ layer 1 may be the BMD layer 2, or only a further portion of the part of the silicon single crystal wafer 100 other than the DZ layer 1 may be the BMD layer 2.

Moreover, the inventive silicon single crystal wafer has a characteristic in that, in particular, the thickness of the DZ layer is 5 to 12.5 µm, preferably 5 to 10 µm, and the BMD density of the BMD layer is $1\times10^{11}/cm^3$ or higher. When the thickness of the DZ layer and the BMD density of the BMD layer are within the above ranges, a silicon single crystal wafer having an extremely high effect of absorbing dislocations can be achieved. When a multilayer structure device is formed using such a silicon single crystal wafer, the occurrence and extension of dislocations that occur in the device formation region can be suppressed, and the generation of defects such as slips can be suppressed.

In addition, in the inventive silicon single crystal wafer, when a dent is formed and a heat treatment at a temperature of 900° C. for 1 hour is performed in the above-described manner, the rosette length of the dislocation in the DZ layer after the heat treatment becomes shorter than the rosette length of the dislocation in the DZ layer of a silicon single crystal wafer (PW) that does not have a BMD layer formed. Such a silicon single crystal wafer has a higher ability to suppress the occurrence and extension of dislocations.

Next, the inventive method for manufacturing a silicon single crystal wafer will be described in detail.

To manufacture a silicon single crystal wafer having at least a DZ layer with a thickness of 5 to 12.5 µm and a BMD layer which is positioned immediately below the DZ layer and which has a BMD density of $1\times10^{11}/cm^3$ or higher, a silicon single crystal wafer with an oxygen concentration of 12 ppma (JEITA) or higher composed of an $N_V$ region is used. The upper limit of the oxygen concentration is not particularly limited, but can be, for example, 17 ppma (JEITA) or lower. A CW wafer that satisfies such specifications is prepared, and firstly, an RTA treatment is performed in a nitrogen-containing atmosphere and at a temperature of 1225° C. or higher. The heat treatment conditions of this RTA treatment are preferably less than 10 seconds at a temperature falling rate of 30° C./second or higher. The lower limit of the heat treatment time of the RTA treatment is not particularly limited, and can be, for example, 1 second or more. The upper limit of the temperature falling rate is not particularly limited either, but can be, for example, 100° C./second or lower. When the temperature falls rapidly from a high heat treatment temperature in this manner, the effect of suppressing the outward diffusion of vacancies becomes higher so that the vacancy distribution in the depth direction can be made more precipitous. As a result, the BMD density distribution can be made more precipitous. Note that the upper limit of the BMD density is not particularly limited, but can be, for example $1\times10^{12}/cm^3$ or lower.

After performing the RTA treatment, a mirror-polish processing is performed. The conditions for the mirror-polish processing are not particularly limited, and mirror polishing that satisfies ordinary specifications can be performed.

By performing a BMD-forming heat treatment on the silicon single crystal wafer subjected to the mirror-polish processing treatment, a BMD layer with a BMD density of $1\times10^{11}/cm^3$ or higher is formed. The heat treatment conditions for the BMD formation in this event are preferably an argon atmosphere, 870 to 950° C., and 2 hours or more. With such heat treatment conditions, only those having a large precipitate nucleus size to some extent grow, and therefore, BMD distribution can be made more precipitous. Regarding the duration of the heat treatment, no further change can be observed in the BMD density distribution with an excessively long duration. Therefore, 8 hours or less, for example, is efficient and preferable.

EXAMPLE

Hereinafter, the present invention will be described in detail with reference to Examples, but the present invention is not limited thereto.

Example 1

Firstly, silicon single crystal CW wafers having a diameter of 300 mm, being <100>, P-type, 10 Ωcm, having an oxygen concentration of 14 ppma (JEITA), and having a defect region of an Nv region across the entire surface were prepared. These CW wafers were subjected to a heat treatment at a temperature of 1225 to 1300° C. for a duration of 9 seconds in an $NH_3$+Ar atmosphere as an RTA treatment. Subsequently, a PW-process was performed with a target machining allowance of 6 µm. In this manner, a nitride film formed in the RTA treatment was removed. Lastly, a heat treatment was performed at a temperature of 1200° C. for a duration of 2 hours in an Ar atmosphere as the BMD-forming heat treatment. The DZ layer thickness and the BMD density of the obtained silicon single crystal wafers were measured. The DZ layer thickness was 6.7 to 10.5 µm, and the BMD density was $1.8\times10^{11}$ to $4.9\times10^{11}/cm^3$. In addition, FIG. 4 shows a cross-sectional TEM image of a case with an RTA treatment temperature of 1300° C., a DZ layer thickness of 6.7 µm, and a BMD density of $4.9\times10^{11}/cm^3$.

In addition, using a similar CW, a dent with a depth of 1 to 5 µm was formed with a pushing pressure of 0.24 to 2.9 N on the surface of the wafer subjected to the RTA treatment and the BMD-forming heat treatment. Then, the rosette length was measured by the rosette test before and after performing the heat treatment at 900° C. for 1 hour. The difference in the rosette lengths obtained in this manner was calculated as the rosette length difference.

Comparative Example 1

The treatments and the evaluation were performed in the same manner as Example 1 except that the RTA treatment temperature was set to 1150° C. to 1200° C. The DZ layer thickness was 14.7 to 19.4 µm, and the BMD density was $3.5\times10^9$ to $6.6\times10^{10}/cm^3$.

The rosette length difference in Example 1 was 2 to 13 µm. On the other hand, the rosette length difference in Comparative Example 1 was −3 to −12 µm. As described, it can be observed that the occurrence and extension of dislocations can be suppressed effectively in the silicon single crystal wafer of the Example. This indicates that when the rosette length of the dislocations after the heat treatment for extending (growing) the dislocations was short, an effect of absorbing the dislocations was achieved by forming a high-density BMD layer immediately below the DZ layer.

Example 2

Samples were produced under the same conditions as Example 1, except that silicon single crystal CW wafers with an oxygen concentration of 12 ppma (JEITA) were used and that the RTA treatment temperature was set to 1225 to 1250° C. The obtained silicon single crystal wafers had a DZ layer thickness of 10.3 to 12.3 μm and a BMD density of $1.3 \times 10^{11}$ to $1.7 \times 10^{11}/cm^3$. The rosette length difference was 0.5 to 6.0 μm.

Comparative Example 2

Samples were produced under the same conditions as Example 1, except that silicon single crystal CW wafers with an oxygen concentration of 12 ppma (JEITA) were used and that the RTA treatment temperature was set to 1175 to 1200° C. The obtained silicon single crystal wafers had a DZ layer thickness of 15.7 to 18.7 μm and a BMD density of $5.4 \times 10^9$ to $7.1 \times 10^{10}/cm^3$. The rosette length difference was −2.0 to −5.5 μm.

The results of Example 2 and Comparative Example 2 are shown in FIG. 5. In Example 2, silicon single crystal wafers with a rosette length difference in the positive range were successfully obtained.

Comparative Example 3

Samples were produced under the same conditions as Example 1, except that silicon single crystal CW wafers with an oxygen concentration of 11 ppma (JEITA) were used and that the RTA treatment temperature was set to 1225 to 1300° C. The obtained silicon single crystal wafers had a DZ layer thickness of 21.5 to 33.0 μm and a BMD density of $1.0 \times 10^9$ to $4.6 \times 10^9/cm^3$. The rosette length difference was −5.0 to −12.0 μm.

The results of Comparative Example 3 are shown in FIG. 6. When the oxygen concentration was lower than 12 ppma (JEITA), it was not possible to obtain silicon single crystal wafers with a positive rosette length difference even when the RTA treatment temperature was raised.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A silicon single crystal wafer for a multilayer structure device, wherein
    the silicon single crystal wafer is composed of an NV region,
    has at least a DZ layer and a BMD layer which is positioned immediately below the DZ layer in order from a surface of the silicon single crystal wafer,
    the DZ layer has a thickness of 5 to 12.5 μm and the BMD layer has a BMD density of $1 \times 10^{11}/cm^3$ or higher,
    when a dent with a dent depth of Depth on the surface of the silicon single crystal wafer is formed so as to satisfy a relational equation $$Depth = 3 \times Fz^{0.6}$$

where Depth is a dent depth (unit: μm), Fz is a pushing pressure (unit: N), and Depth is 0.01 μm or more and less than 5.00 μm,
    by applying the pushing pressure Fz, the silicon single crystal wafer has a stacked structure with at least 3 layers including a strained layer, a DZ layer, and a BMD layer in order from the surface, and
    when the silicon single crystal wafer having the dent formed is subjected to a heat treatment at a temperature of 900° C. for 1 hour, a rosette length of a dislocation of the DZ layer after the heat treatment becomes shorter than a rosette length of a dislocation of the DZ layer before the heat treatment.

* * * * *